US010911054B2

(12) United States Patent
Yeo et al.

(10) Patent No.: US 10,911,054 B2
(45) Date of Patent: Feb. 2, 2021

(54) DIGITAL-TO-TIME CONVERTER (DTC) ASSISTED ALL DIGITAL PHASE LOCKED LOOP (ADPLL) CIRCUIT

(71) Applicant: Huawei International Pte. Ltd., Singapore (SG)

(72) Inventors: Theng Tee Yeo, Singapore (SG); Xuesong Chen, Singapore (SG); Rui Yu, Singapore (SG); Liu Supeng, Singapore (SG); Chao Yuan, Singapore (SG)

(73) Assignee: Huawei International Pte. Ltd., Singapore (SG)

( * ) Notice: Subject to any disclaimer, the term of this patent is extended or adjusted under 35 U.S.C. 154(b) by 0 days.

(21) Appl. No.: 16/906,788

(22) Filed: Jun. 19, 2020

(65) Prior Publication Data

US 2020/0321968 A1    Oct. 8, 2020

Related U.S. Application Data

(63) Continuation of application No. PCT/SG2017/050627, filed on Dec. 19, 2017.

(51) Int. Cl.
*H03L 7/093* (2006.01)

(52) U.S. Cl.
CPC .......... *H03L 7/093* (2013.01); *H03L 2207/50* (2013.01)

(58) Field of Classification Search
CPC combination set(s) only.
See application file for complete search history.

(56) References Cited

U.S. PATENT DOCUMENTS 9,455,667 B2    9/2016    Vlachogiannakis et al.
10,594,301 B1 *  3/2020    Heidary Shalmany ....................
                                                    H03K 3/011
(Continued)

FOREIGN PATENT DOCUMENTS

EP    3035535 A1    6/2016
EP    3119000 A1    1/2017

OTHER PUBLICATIONS

Liu et al., "An Ultra-Low Power 1.7-2.7 GHz Fractional-N Sub-Sampling Digital Frequency Synthesizer and Modulator for IoT Applications in 40 nm CMOS," IEE Transactions on Circuits and Systems-I: Regular Papers, vol. 64, No. 5, pp. 1094-1105, XP011647144, Institute of Electrical and Electronics Engineers, New York, New York (May 2017).

(Continued)

*Primary Examiner* — Adam D Houston
(74) *Attorney, Agent, or Firm* — Leydig, Voit & Mayer, Ltd.

(57) ABSTRACT

A digital-to-time converter (DTC) assisted all digital phase locked loop (ADPLL) circuit is disclosed, which comprises: a DTC error compensator arranged to receive a phase offset signal being a processed output from a time-to-digital converter (TDC) circuit, the phase offset signal includes a DTC error corresponding to a phase difference between a reference clock signal processed by a DTC circuit and a feedback clock signal derived from an output signal of the ADPLL circuit. The compensator is arranged to process the phase offset signal for generating a digital signal representative of the DTC error, which is provided as an output signal. Also, the output signal is arranged to be subtracted from the phase offset signal to obtain a phase rectified signal of the phase offset signal.

13 Claims, 3 Drawing Sheets

(56) References Cited

U.S. PATENT DOCUMENTS

| | | | | |
|---|---|---|---|---|
| 2012/0288044 | A1* | 11/2012 | Roberts | G06F 1/022 375/350 |
| 2015/0280842 | A1* | 10/2015 | Mayer | H04B 1/62 375/316 |
| 2016/0182026 | A1* | 6/2016 | Meier | H04B 1/16 455/95 |
| 2016/0182072 | A1* | 6/2016 | Preyler | H03L 7/16 327/105 |
| 2017/0019115 | A1* | 1/2017 | Van Den Heuvel | H03L 7/0814 |
| 2017/0063387 | A1* | 3/2017 | Gao | H03B 5/1228 |
| 2017/0329284 | A1* | 11/2017 | Wu | H03M 3/414 |
| 2017/0366191 | A1* | 12/2017 | Wang | H03L 7/0814 |
| 2017/0366376 | A1* | 12/2017 | Wang | H04L 27/0014 |
| 2018/0091177 | A1* | 3/2018 | Banin | H04B 1/0475 |
| 2018/0110018 | A1* | 4/2018 | Yu | H04L 7/04 |
| 2018/0191384 | A1* | 7/2018 | Caffee | H03F 3/2175 |
| 2018/0205370 | A1* | 7/2018 | Jin | H03L 7/091 |
| 2019/0268010 | A1* | 8/2019 | Wu | G04F 10/04 |
| 2020/0280318 | A1* | 9/2020 | Preissi | H03L 7/0814 |

OTHER PUBLICATIONS

Zhuang et al., "A Low-Power All-Digital PLL Architecture Based on Phase Prediction," 2012 19th IEEE International Conference on Electronics, Circuits, and Systems (ICECS), pp. 797-800, XP032331578, Institute of Electrical and Electronics Engineers, New York, New York (Dec. 2012).

Chen et al., "Fractional Spur Suppression in All-Digital Phase-Locked Loops," 2015 IEEE International Symposium on Circuits and Systems (ISCAS), pp. 2565-2568, XP033183740, Institute of Electrical and Electronics Engineers, New York, New York (May 2015).

Elkholy et al., "A 3.7 mW Low-Noise Wide-Bandwidth 4.5 GHz Digital Fractional-N PLL Using Time Amplifier-Based TDC," IEEE Journal of Solid-State Circuits, vol. 50, No. 4, pp. 867-881, Institute of Electrical and Electronics Engineers, New York, New York (Apr. 2015).

* cited by examiner

United States Patent 10,911,054 B2

DIGITAL-TO-TIME CONVERTER (DTC) ASSISTED ALL DIGITAL PHASE LOCKED LOOP (ADPLL) CIRCUIT

CROSS-REFERENCE TO RELATED APPLICATIONS

This application is a continuation of International Application No. PCT/SG2017/050627, filed on Dec. 19, 2017, the disclosure of which is hereby incorporated by reference in its entirety.

FIELD

The present disclosure relates to a digital-to-time converter (DTC) assisted all digital phase locked loop (ADPLL) circuit.

BACKGROUND

High performance All Digital Phase-Locked Loops (ADPLLs) have been proposed as an attractive alternative to traditional analog PLLs. ADPLLs offer several advantages such as small IC implementation area, manufacturability and programmability over analog PLLs. Analog PLLs typically require large on-chip capacitors, which are prone to electrical leakages that often degrade PLL performance. In contrast, ADPLLs use digital synchronous logic based loop filters, and are thus more compact and less sensitive to external noise and process, voltage, and temperature (PVT) variations. Furthermore, a Time-to-Digital Converter (TDC) is typically adopted to avoid using analog-intensive components (e.g. a charge pump), which are more difficult to implement and operate under low supply voltage in advanced nano-scale CMOS technologies. Specifically, the continuous scaling of CMOS processes favours digital circuits over their analog counterparts.

Presently, two types of TDC-based ADPLL architectures are extensively adopted: the divider-assisted ADPLL, and the divider-less (sub-sampling) ADPLL. The divider-assisted ADPLL adopts a programmable divider to achieve fractional frequency resolution. Unfortunately, a delta-sigma modulator introduces high-frequency noise at the input of the TDC, thus imposing stringent requirements on the loop bandwidth of the ADPLL and linearity of the TDC. For the divider-less ADPLL, the TDC is now moved to the feedback path and the output phase is quantized to digital codes directly using combination of a high-speed counter and a TDC. Specifically, the output phase is free of the unwanted high-frequency noise. However, resolution step of the TDC has to be normalized to the counter input clock period, incurring the need for accurate calibration.

In both the TDC-based ADPLL architectures, a high performance TDC with fine resolution and sufficient dynamic range to cover at least one oscillator period measurement range is needed. As the TDC quantization noise is low-pass filtered by the ADPLL's feedback loop, it thus limits in-band phase noise of the ADPLL. Also the TDC is typically the main source of spurs, whose level is a function of the resolution and nonlinearity of its conversion characteristic. Digital-to-Time (DTC) assisted ADPLL has interestingly been proposed to ease the resolution/dynamic range requirements of the TDC. The adoption of the DTC allows a lower number of bits of the TDC, even down to the limit case of a single-bit TDC. In principle, DTC requires less operating power than a TDC with the same number of bits, thereby substantially reducing the overall power consumption of the synthesizer, and it naturally takes advantage of over-sampling and sub-ranging.

A conventional DTC-assisted (sub-sampling) ADPLL 100 is depicted in FIG. 1, in which the dynamic range requirement of the TDC is greatly relaxed in this case. However, the non-linearity of the DTC caused by mismatch between delay cells and routing paths severely degrades the spurious and in-band noise performance of the ADPLL. So to mitigate these non-linear errors, complex background non-linearity calibration technique was employed at the expense of large IC implementation area, high power, and long settling time.

One object of the present disclosure is therefore to address at least one of the problems of the prior art and/or to provide a choice that is useful in the art.

SUMMARY

According to a $1^{st}$ aspect of the disclosure, there is provided a digital-to-time converter (DTC) assisted all digital phase locked loop (ADPLL) circuit comprising: a DTC error compensator arranged to receive a phase offset signal being a processed output from a time-to-digital converter (TDC) circuit, the phase offset signal includes a DTC error corresponding to a phase difference between a reference clock signal processed by a DTC circuit and a feedback clock signal derived from an output signal of the ADPLL circuit. The compensator includes: a first circuit arranged with a de-multiplexer configured to receive the phase offset signal and a multiplexer, and a plurality of low pass filter circuits electrically coupled to the de-multiplexer and multiplexer, the low pass filter circuits respectively configured to be operated based on the reference clock signal, the de-multiplexer configured to output the phase offset signal to a selected low pass filter circuit based on a DTC input control word to the DTC circuit, said selected low pass filter circuit configured to filter the phase offset signal to generate a digital signal representative of the DTC error, the multiplexer configured to output the digital signal based on the DTC input control word as an output signal of the compensator. The output signal from the compensator is arranged to be subtracted from the phase offset signal to obtain a phase rectified signal of the phase offset signal.

Preferably, the ADPLL circuit may further comprise a digital loop filter, wherein the output signal from the compensator is provided to the digital loop filter to be processed prior to being transmitted to a digitally controlled oscillator.

Preferably, the plurality of low pass filter circuits may include being configured in a parallel arrangement.

Preferably, the ADPLL circuit may further include a fractional phase calculation module configured to process the output from the TDC circuit based on the DTC input control word to obtain a fractional signal.

Preferably, the ADPLL circuit may further include: a second circuit arranged with a multiplexer and a plurality of integrators electrically coupled to the multiplexer and the respective low pass filter circuits, the integrators respectively configured to be operated based on a frame clock signal, the integrators configured to receive respective digital signals from the respective low pass filter circuits for processing to generate a further digital signal, the multiplexer configured to output the further digital signal based on the DTC input control word as a second output signal of the compensator. The second output signal from the compensator is arranged to be subtracted during processing of the output from the TDC circuit to generate a subsequent phase offset signal, prior to being provided to the compensator.

Preferably, each integrator may include a D flip-flops circuit and an adder.

Preferably, the plurality of integrators may include being configured in a parallel arrangement.

According to a $2^{nd}$ aspect of the disclosure, there is provided a digital-to-time converter (DTC) assisted all digital phase locked loop (ADPLL) circuit for processing frame-based transmissions, the circuit comprising: a DTC error compensator arranged to receive a phase offset signal being a processed output from a time-to-digital converter (TDC) circuit, the phase offset signal includes a DTC error corresponding to a phase difference between a reference clock signal processed by a DTC circuit and a feedback clock signal derived from an output signal of the ADPLL circuit. The compensator includes: a first circuit arranged with a de-multiplexer configured to receive the phase offset signal and a multiplexer, and a plurality of low pass filter circuits electrically coupled to the de-multiplexer and multiplexer, the low pass filter circuits respectively configured to be operated based on the reference clock signal, the de-multiplexer configured to output the phase offset signal to a selected low pass filter circuit based on a DTC input control word to the DTC circuit, said selected low pass filter circuit configured to filter the phase offset signal to generate a digital signal representative of the DTC error, the multiplexer configured to output the digital signal based on the DTC input control word as a first output signal of the compensator; and a second circuit arranged with a multiplexer and a plurality of integrators electrically coupled to the multiplexer and the respective low pass filter circuits, the integrators respectively configured to be operated based on a frame clock signal, the integrators configured to receive respective digital signals from the respective low pass filter circuits for processing to generate a further digital signal, the multiplexer configured to output the further digital signal based on the DTC input control word as a second output signal of the compensator. The first output signal is arranged to be subtracted from the phase offset signal to obtain a phase rectified signal of the phase offset signal. The second output signal is arranged to be subtracted during processing of the output from the TDC circuit to generate a subsequent phase offset signal, prior to being provided to the compensator.

Preferably, the ADPLL circuit may further comprise a digital loop filter, wherein the output signal from the compensator is provided to the digital loop filter to be processed prior to being transmitted to a digitally controlled oscillator.

Preferably, the plurality of low pass filter circuits may include being configured in a parallel arrangement.

Preferably, the ADPLL circuit may further include a fractional phase calculation module configured to process the output from the TDC circuit based on the DTC input control word to obtain a fractional signal.

Preferably, each integrator may include a D flip-flops circuit and an adder.

Preferably, the plurality of integrators may include being configured in a parallel arrangement.

It should be apparent that features relating to one aspect of the disclosure may also be applicable to the other aspects of the disclosure.

These and other aspects of the disclosure will be apparent from and elucidated with reference to the embodiments described hereinafter.

BRIEF DESCRIPTION OF THE DRAWINGS

Embodiments of the disclosure are disclosed hereinafter with reference to the accompanying drawings, in which.

DETAILED DESCRIPTION OF PREFERRED EMBODIMENTS

Figure 1:
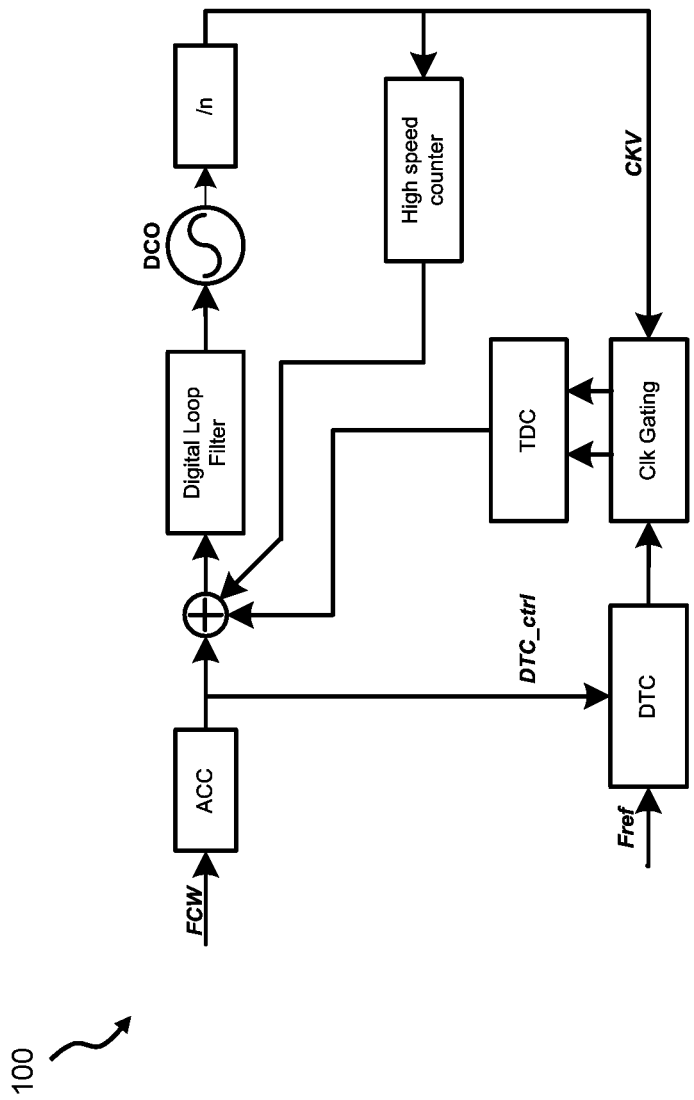
FIG. 1 shows schematics of a digital-to-time converter (DTC) assisted all digital phase locked loop (ADPLL), according to the prior art.
Figure 2:
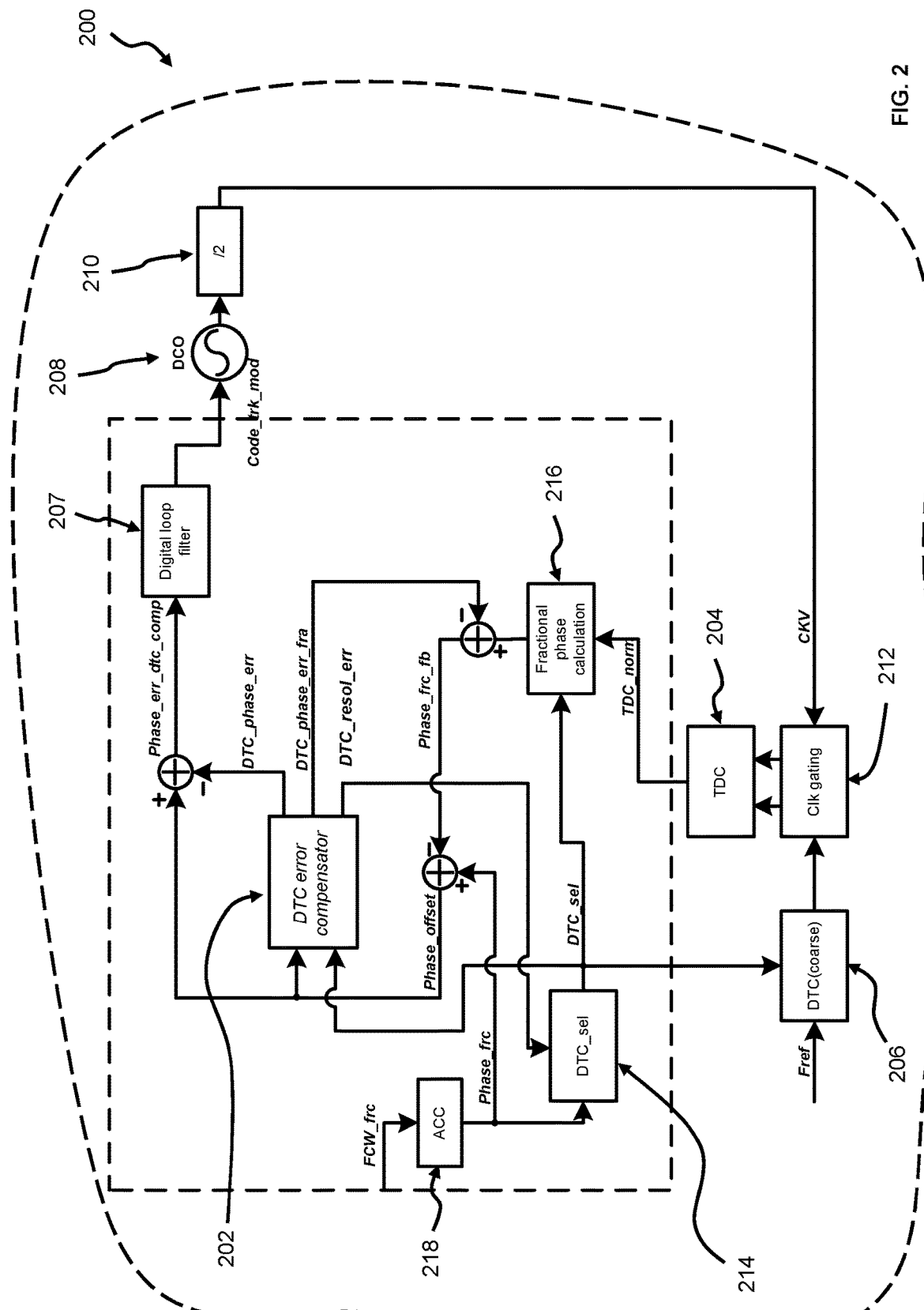
FIG. 2 shows schematics of a DTC-assisted ADPLL circuit, according to an embodiment.
Figure 3:
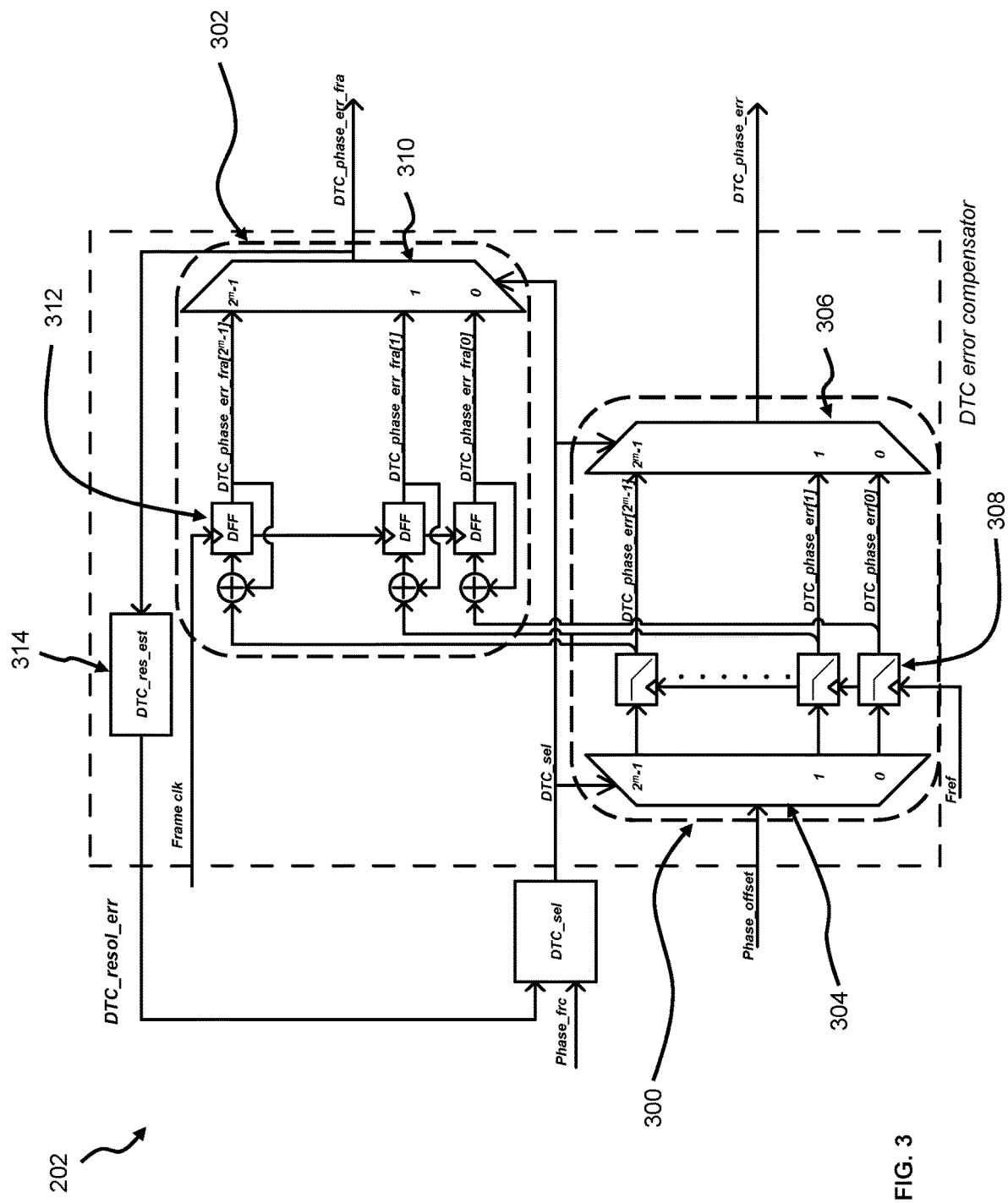
FIG. 3 shows schematics of a DTC error compensator of the ADPLL circuit of FIG. 2.

FIG. 2 depicts schematics of a DTC-assisted ADPLL circuit 200 (with bitwise DTC error correction), according to an embodiment. For brevity, the DTC-assisted ADPLL circuit 200 is termed as ADPLL circuit 200 hereinafter. Broadly, the ADPLL circuit 200 comprises (at least) a DTC error compensator 202 arranged to receive a phase offset signal (i.e. "Phase_offset") being a processed output from a time-to-digital converter (TDC) circuit 204, the phase offset signal includes a DTC error corresponding to a phase difference between a reference clock signal (i.e. "$F_{ref}$") processed by a DTC circuit 206 and a feedback clock signal (i.e. "CKV") derived from an output signal of the ADPLL circuit 200. With reference to FIG. 2, the processed output (from the TDC circuit 204) in the above context is generated in this manner (i.e. see equation (4)): the "TDC_norm" signal (from the TDC circuit 204) is processed by a fractional phase calculation module 216 to generate the "Phase_frc_fb" signal. For clarity, the "TDC_norm" signal is the normalised TDC output of the TDC circuit 204. The "Phase_frc_fb" signal is the processed output (i.e. a processed "TDC_norm" signal). More will be elaborated on this signal processing aspect below. Also in this case, the TDC circuit 204 has a fine resolution, while the DTC circuit 206 has a coarse resolution. FIG. 3 shows schematics of the DTC error compensator 202, which includes a first multiplexer circuit 300 and a second multiplexer circuit 302.

The first multiplexer circuit 300 is arranged with a de-multiplexer 304 configured to receive the phase offset signal and a multiplexer 306, and a plurality of low pass filter circuits 308 electrically coupled to the de-multiplexer 304 and multiplexer 306. The low pass filter circuits 308 are configured in a parallel arrangement with respect to the de-multiplexer 304 and multiplexer 306. The low pass filter circuits 308 are respectively configured to be operated based on the reference clock signal, and the de-multiplexer 304 is configured to output the phase offset signal to a selected low pass filter circuit 308 based on a DTC control word (which is provided to both the de-multiplexer 304 and multiplexer 306). The selected low pass filter circuit 308 is configured to (low-pass) filter the phase offset signal to generate a first digital signal representative (i.e. "DTC_phase_err[x]", where "x" represents "DTC_sel") of the DTC error. The multiplexer 306 is then configured to output the first digital signal, based on the DTC control word, as a first output signal (i.e. "DTC_phase_err") of the compensator 202. It is to be noted that the first output signal is a DTC error vector.

On the other hand, the second multiplexer circuit 302 is arranged with a multiplexer 310 and a plurality of integrators 312 electrically coupled to the multiplexer 310 and the respective low pass filter circuits 308. In one example, each integrator 312 is implemented using a D flip-flops circuit and an adder. The integrators 312 are configured in a parallel arrangement with respect to the multiplexer 310. Also, the integrators 312 are respectively configured to be operated based on a frame clock signal (i.e. "Frame_clk"). Further, the integrators 312 are configured to receive respective first digital signals from the respective low pass filter circuits 308 for processing to generate a second digital signal. Then, the multiplexer 310 is configured to output the second digital signal, based on the DTC control word, as a second output signal (i.e. "DTC_phase_err_fra") of the compensator 202. It is to be appreciated that the second output signal is the only frame-based DTC error vector (in this embodiment) that is updated at the frame clock rate (i.e. "Frame_clk"). More specifically, the first output signal from the compensator 202 is arranged to be (signal) subtracted from the phase offset signal to obtain a phase rectified signal (i.e. "Phase_err_dtc_comp") of the phase offset signal (i.e. refer to FIG. 2), and the second output signal is arranged to be subtracted during processing of the output from the TDC circuit 204 to generate a subsequent phase offset signal, prior to being provided to the compensator 202. Generally, this means that any DTC error calibrated in one signal-frame is passed down to a next immediate signal-frame for DTC error correction.

It is to be appreciated that for processing frame-based RF transmissions, both the first multiplexer circuit 300 and the second multiplexer circuit 302 (of the compensator 202) are electrically activated for the processing. Notwithstanding this, the second multiplexer circuit 302 may also optionally be switched off, if desired, for frame-based RF transmissions, although it then means that the processing is no longer optimal. The compensator 202 is also configured to handle non-frame-based RF transmissions (e.g. continuous transmissions). For non-frame-based RF transmissions, the first multiplexer circuit 300 is arranged to run continuously, whereas the second multiplexer circuit 302 is electrically deactivated. On the other hand, should frame-based RF transmissions are to be processed again by the proposed ADPLL circuit 200, then the second multiplexer circuit 302 will be switched on as before for operation.

It is to be appreciated that the proposed ADPLL circuit 200 is devised to be an ultra-low power ADPLL specifically intended for short-range based Internet-of-Things (IoT) applications, based on such as Bluetooth Low Energy (BTLE), Zigbee, and etc. Generally, low power consumption is a main challenge for battery powered applications. To realise a low power design, a DTC-based sub-sampling architecture is thus adopted for the ADPLL circuit 200. To this end, the ADPLL circuit 200 may also include a digital loop filter 207, a LC-based Digitally Controlled Oscillator (DCO) 208, a frequency divider 210 (i.e. a divide-by-2 counter), a high speed frequency counter (not shown), and a clock gating circuit 212. Referring to FIG. 2, the LC-based DCO 208 is arranged intermediate the frequency divider 210 and the digital loop filter 207. Particularly, the phase rectified signal (i.e. "Phase_err_dtc_comp") is fed to the digital loop filter 207 for processing, before being forwarded to the LC-based DCO 208. It is to be appreciated that the digital loop filter 207 outputs a "code_trk_mod" signal (as shown in FIG. 2), in which said signal is a DCO input control word in tracking mode. Then, the clock gating circuit 212 is configured to receive signals processed by the DTC circuit 206, and also the feedback clock signal (forwarded by the frequency divider 210). The clock gating circuit 212 is arranged to forward processed signals to the TDC circuit 204.

It is to be appreciated that the LC-based DCO 208 may be tuned digitally with fine frequency resolution. The frequency divider 210 is arranged for dividing output of the LC-based DCO 208 to a half-rate signal CKV (to be provided as the feedback clock signal). The high speed frequency counter is configured to directly run at CKV and is only enabled during initial frequency calibration (i.e. coarse frequency tuning and medium frequency tuning). In a tracking state of the ADPLL circuit 200 (which is locked to a fractional channel), the high speed frequency counter is disabled to save power. The DTC circuit 206 is controlled to minimized operating time of the TDC circuit 204 by (phase) aligning the reference clock signal and feedback clock signal. The compensator 202 is devised to be part of a DTC calibration loop of the ADPLL circuit 200, and the DTC calibration loop further includes a DTC_sel engine module 214, the fractional phase calculation module 216, and a DTC resolution estimator 314 (i.e. labelled as "DTC_res_est" in FIG. 3). The DTC resolution estimator 314 is specifically arranged to implement the mathematical function defined in equation (6) set out below, in order to generate a "DTC_resol_err" (i.e. which is a DTC average step error) signal. It is to be appreciated that DTC nonlinearity is detected (by the DTC resolution estimator 314) in the tracking mode at the output of the compensator 202 for a DTC step selected. It is to be appreciated that the DTC step is the control code input, "DTC_sel", to the DTC circuit 206. More specifically, the "DTC_sel" is calculated by the DTC_sel engine module 214, based on equation (1) set out below. The DTC_sel engine module 214 is also configured to receive a "phase_frc" signal (i.e. a fractional phase control word) from an accumulator ("ACC") 218, which itself receives a "FCW_frc" signal (i.e. fractional part of a frequency control word). For avoidance of doubt, the DTC resolution estimator 314 is part of the compensator 202. The fractional phase calculation module 216 is configured to receive the "TDC_norm" signal (i.e. a normalised signal) from the TDC circuit 204, which is processed (in accordance with the frequency control word) to output a processed signal. This processed signal is then processed with the second output signal (i.e. "DTC_phase_err_fra"), as shown in FIG. 2. Further, the DTC_sel engine module 214 receives the "DTC_resol_err" signal from the compensator 202 to enable optimum selection of a DTC control word.

Next, the error calibration and compensation functions performed by the compensator 202 are set out in more detail below. It is to be appreciated that "DTC_phase_err" may be calibrated in the background and subtracted from the detected phase offset (i.e. the first digital signal). Furthermore, "DTC_phase_err_fra" may be calibrated on a frame-to-frame basis, and subtracted by the fractional phase calculation module 216, as afore explained. For clarity, the frame refers to a transmission frame, and the same definition is applied hereinafter, unless otherwise explicitly stated.

For each frame, the ADPLL circuit 200 first goes through a state of frequency coarse tuning and frequency medium tuning. Then, the ADPLL circuit 200 enters a frequency fine tuning state (i.e. the tracking state). In the tracking state, a DTC control word, "DTC_sel", is generated according to the fractional phase "phase_frc". The DTC control word, "DTC_sel", is selected to minimize operating time of the TDC circuit 204 by aligning the reference clock signal and the feedback clock signal. Specifically, the code selection can be described by equation (1):

$$\text{DTC\_sel} = \text{round}\left(\frac{1 - \text{phase\_frc}}{\text{DTC\_RF phase\_stage}}\right) \quad (1)$$

wherein DTC_RFphase_stage is the effective RF phase resolution of the DTC circuit 206.

For each phase error comparison, the phase error is recorded as the DTC_phase_err for a selected DTC control word, "DTC_sel", as set out in equation (2):

$$DTC\_phase\_err(DTC\_sel)=(1-alpha)\cdot DTC\_phase\_err(DTC\_sel)+alpha\cdot phase\_offset \quad (2)$$

wherein alpha is the filter coefficient. The calibration defined in equation (2) is updated at a frequency equal to the input rate of the reference clock signal.

Next, the DTC nonlinearity is compensated by subtraction from the phase_offset, as defined in equation (3):

$$phase\_err\_dtc\_comp=phase\_offset-DTC\_phase\_err(DTC\_sel) \quad (3)$$

It is to be noted that this DTC error compensation is able to run in the background to minimize the DTC error.

In RF transmitters that use frequency hopping for transmission, the carrier frequency is configured to change from frame-to-frame. For example, Bluetooth transceivers utilize frequency hopping and transit frames. The background DTC error compensation as mentioned takes some time to sweep through all the DTC control words, and hence the DTC error vector needs a certain time to reach a steady state. In this respect, the "DTC_phase_err_fra" is introduced and updated from frame-to-frame. The "DTC_phase_err_fra" is subtracted in the fractional phase calculation module 216. This error reduction is described by equation (4):

$$phase\_frc\_fb=1-TDC\_norm-DTC\_sel\cdot DTC\_RFphase\_stage-DTC\_phase\_err\_fra(DTC\_sel) \quad (4)$$

wherein TDC_norm is the normalized TDC output.

For completeness, it is also highlighted that equation (4) in fact describes the actual operation the fractional phase calculation module 216 is configured for. Moreover, if the DTC circuit 206 is ideal, then based on equation (4), the "Phase_frc_fb" signal generated will be equal to the desired phase "phase_frc".

At the end of a signal-frame, the "DTC_phase_err_fra" is updated as per equation (5):

$$DTC\_phase\_err\_fra(:)=DTC\_phase\_err\_fra(:)+DTC\_phase\_err \quad (5)$$

The DTC gain can subsequently be calculated based on equation (6) in the DTC resolution estimator 314:

$$DTC\_resol\_err=(DTC\_phase\_err\_fra(DTC\_sel\_max)-DTC\_phase\_err\_fra(DTC\_sel\_min))/(DTC\_sel\_max-DTC\_sel\_min) \quad (6)$$

wherein DTC_sel_max and DTC_sel_min collectively define a DTC range used for timing adjustment. Particularly, the DTC resolution is calculated based on the first and last DTC step value in order to obtain a DTC step resolution. It is to be appreciated that the calibration of equation (6) is updated at frame rate. The definition of "frame rate" may be understood that in certain applications, e.g. Bluetooth, the RF transmission is frame-based. Specifically, Bluetooth is devised to transmit for 20 ms, stop for another tens of ms, and transmit 20 ms again, so on and so forth.

To summarise, the (bit-wise) DTC calibration method performed by the disclosed ADPLL circuit 200 beneficially removes the effect of DTC mismatch and DTC resolution variation. This advantageously translates to reduced IPN and spurious tone levels. Also, the DTC calibration method is devised to work frame-to-frame (in terms of generating and updating the frame-based DTC error vector) and also in the background. Notwithstanding that, the DTC calibration method may also work with non-frame-based transmissions (e.g. continuous transmissions). It is also to be appreciated that the DTC_phase_error is scaled frame-to-frame, according to the Frequency Control Word (which is proportional to frequency, and phase is equal to 2*Pi/frequency). With the "DTC_phase_err_fra" updated from the first frame, the "DTC_phase_err" will be substantially reduced from the second frame onwards, which thus greatly reduce calibration loop settling time. Moreover, the ADPLL circuit 200 (which uses the DTC-assisted sub-sampling architecture) reduces the input dynamic range to the TDC circuit 204 to within one DTC step, thereby achieving lower power consumption.

While the disclosure has been illustrated and described in detail in the drawings and foregoing description, such illustration and description are to be considered illustrative or exemplary, and not restrictive; the disclosure is not limited to the disclosed embodiments. Other variations to the disclosed embodiments can be understood and effected by those skilled in the art in practicing the claimed embodiments.

What is claimed is:

1. A digital-to-time converter (DTC) assisted all digital phase locked loop (ADPLL) circuit comprising:
 a DTC error compensator arranged to receive a phase offset signal, wherein the phase offset signal is a processed output from a time-to-digital converter (TDC) circuit, the phase offset signal includes a DTC error corresponding to a phase difference between a reference clock signal processed by a DTC circuit and a feedback clock signal derived from an output signal of the ADPLL circuit, the compensator including:
 a first circuit arranged with a de-multiplexer configured to receive the phase offset signal, a multiplexer, and a plurality of low pass filter circuits electrically coupled to the de-multiplexer and the multiplexer, the plurality of low pass filter circuits respectively configured to be operated based on the reference clock signal, the de-multiplexer configured to output the phase offset signal to a selected low pass filter circuit based on a DTC input control word to the DTC circuit, said selected low pass filter circuit configured to filter the phase offset signal to generate a digital signal representative of the DTC error, the multiplexer configured to output the digital signal based on the DTC input control word as an output signal of the compensator,
 wherein the output signal of the compensator is arranged to be subtracted from the phase offset signal to obtain a phase rectified signal of the phase offset signal.

2. The ADPLL circuit of claim 1, further comprising a digital loop filter, wherein the output signal of the compensator is provided to the digital loop filter to be processed prior to being transmitted to a digitally controlled oscillator.

3. The ADPLL circuit of claim 1, wherein the plurality of low pass filter circuits are configured in a parallel arrangement.

4. The ADPLL circuit of claim 1, further including a fractional phase calculation module configured to process an output of the TDC circuit based on the DTC input control word to obtain a fractional signal.

5. The ADPLL circuit of claim 1, further including:
 a second circuit arranged with a second multiplexer and a plurality of integrators electrically coupled to the second multiplexer and to respective low pass filter circuits, the plurality of integrators respectively configured to be operated based on a frame clock signal, the plurality of integrators configured to receive respective digital signals from the respective low pass filter circuits for processing to generate a further digital signal, the second multiplexer configured to output the further digital signal based on the DTC input control word as a second output signal of the compensator, wherein the second output signal of the compensator is arranged to be subtracted during processing of the output from the TDC circuit to generate a subsequent phase offset signal, prior to being provided to the compensator.

6. The ADPLL circuit of claim 5, wherein each integrator of the plurality of integrators includes a D flip-flop circuit and an adder.

7. The ADPLL circuit of claim 5, wherein the plurality of integrators are configured in a parallel arrangement.

8. A digital-to-time converter (DTC) assisted all digital phase locked loop (ADPLL) circuit for processing frame-based transmissions, the circuit comprising:
 a DTC error compensator arranged to receive a phase offset signal, wherein the phase offset signal is a processed output from a time-to-digital converter (TDC) circuit, the phase offset signal includes a DTC error corresponding to a phase difference between a reference clock signal processed by a DTC circuit and a feedback clock signal derived from an output signal of the ADPLL circuit, the compensator including:
 (i) a first circuit arranged with a de-multiplexer configured to receive the phase offset signal, a multiplexer, and a plurality of low pass filter circuits electrically coupled to the de-multiplexer and the multiplexer, the plurality of low pass filter circuits respectively configured to be operated based on the reference clock signal, the de-multiplexer configured to output the phase offset signal to a selected low pass filter circuit based on a DTC input control word to the DTC circuit, said selected low pass filter circuit configured to filter the phase offset signal to generate a digital signal representative of the DTC error, the multiplexer configured to output the digital signal based on the DTC input control word as a first output signal of the compensator; and
 (ii) a second circuit arranged with a second multiplexer and a plurality of integrators electrically coupled to the multiplexer and the respective low pass filter circuits, the plurality of integrators respectively configured to be operated based on a frame clock signal, the plurality of integrators configured to receive respective digital signals from the respective low pass filter circuits for processing to generate a further digital signal, the multiplexer configured to output the further digital signal based on the DTC input control word as a second output signal of the compensator, wherein the first output signal is arranged to be subtracted from the phase offset signal to obtain a phase rectified signal of the phase offset signal; and wherein the second output signal is arranged to be subtracted during processing of the output from the TDC circuit to generate a subsequent phase offset signal, prior to being provided to the compensator.

9. The ADPLL circuit of claim 8, further comprising a digital loop filter, wherein the first output signal of the compensator is provided to the digital loop filter to be processed prior to being transmitted to a digitally controlled oscillator.

10. The ADPLL circuit of claim 8, wherein the plurality of low pass filter circuits are configured in a parallel arrangement.

11. The ADPLL circuit of claim 8, further including a fractional phase calculation module configured to process the output from the TDC circuit based on the DTC input control word to obtain a fractional signal.

12. The ADPLL circuit of claim 8, wherein each integrator of the plurality of integrators includes a D flip-flop circuit and an adder.

13. The ADPLL circuit of claim 8, wherein the plurality of integrators are configured in a parallel arrangement.

* * * * *

UNITED STATES PATENT AND TRADEMARK OFFICE
CERTIFICATE OF CORRECTION

PATENT NO. : 10,911,054 B2
APPLICATION NO. : 16/906788
DATED : February 2, 2021
INVENTOR(S) : Yeo et al.

It is certified that error appears in the above-identified patent and that said Letters Patent is hereby corrected as shown below:

On the Title Page

Item (72) Inventors: "Liu Supeng" should read -- Supeng Liu --.

Signed and Sealed this
Twenty-third Day of August, 2022

Katherine Kelly Vidal
*Director of the United States Patent and Trademark Office*